United States Patent [19]

Tyler

[11] Patent Number: 4,999,741
[45] Date of Patent: Mar. 12, 1991

[54] PACKAGE IN THE HEAT DISSIPATION OF ELECTRONIC DEVICES

[75] Inventor: Stephen G. Tyler, Witham, United Kingdom

[73] Assignee: The General Electric Company, p.l.c., London, England

[21] Appl. No.: 300,882

[22] Filed: Jan. 24, 1989

[30] Foreign Application Priority Data

Jan. 26, 1988 [GB] United Kingdom ................. 8801632

[51] Int. Cl.⁵ ............................................. H05K 7/20
[52] U.S. Cl. .................................... 361/387; 165/185; 174/16.3
[58] Field of Search ...................... 165/80.2, 80.3, 185; 357/81; 174/16.3; 361/383, 386, 387, 388; 29/738-740

[56] References Cited

U.S. PATENT DOCUMENTS

| | | | |
|---|---|---|---|
| 4,092,697 | 5/1978 | Spaight | 361/387 |
| 4,381,032 | 4/1983 | Cutchaw | 165/185 |
| 4,602,314 | 7/1986 | Broadbent . | |
| 4,654,754 | 3/1987 | Daszkowski . | |
| 4,689,720 | 8/1987 | Daszkowski . | |
| 4,744,008 | 5/1988 | Black | 361/386 |
| 4,755,249 | 7/1988 | DeGree | 165/185 |

FOREIGN PATENT DOCUMENTS

| | | | |
|---|---|---|---|
| 2883 | 7/1979 | European Pat. Off. . | |
| 61592 | 10/1982 | European Pat. Off. . | |
| 151068 | 8/1985 | European Pat. Off. . | |
| 1587730 | 4/1981 | United Kingdom | 165/185 |

OTHER PUBLICATIONS

"Module-Thermal Resistance", Arnold, IBM Tech Discl. Bull., vol. 21, No. 4, Sep. 78, pp. 1473,4 (361-387).

"Thermally Enhanced-Structure", Coughlin, IBM Tech Disc Bull, vol. 2, No. 1, Jun. 1978, pp. 185 (361/387).

Primary Examiner—Gerald P. Tolin
Attorney, Agent, or Firm—Spencer & Frank

[57] ABSTRACT

Many housings for electronic devices require to be carefully sealed, as well as incorporate heat sinks for the electronic devices. Careful sealing has required expensive machined housing joints and, because electronic devices may be misaligned to the substrate, rounded heat sinks have been used, giving restricted contact areas and hence limited cooling. The invention employs a thermally conducting flexible membrane capable of being urged into thermal contact with the electronic device, for example by a evacuation of the housing, thereby permitting a simple hermetic seal as well as contact with the electronic device over a large area.

12 Claims, 2 Drawing Sheets

PACKAGE IN THE HEAT DISSIPATION OF ELECTRONIC DEVICES

BACKGROUND OF THE INVENTION

1. Field of the Invention

This invention relates to housings for electronic devices.

2. Discussion of the Background

Problems have arisen over the design of such housings for electronic devices. First, in order to seal such housing from the ingress of dirt or moisture, it is necessary to use highly accurate and therefore expensive machined parts for the joints at the interface to achieve a good seal. Second, in the case of planar semi-conductor devices, a device may not be set accurately to the plane of the substrate on which it is mounted, and hence a heat sink may have to have a rounded end to ensure contact with the semi-conductor device. However, such a restricted area of contact causes a restricted heat transfer, and this can cause a problem with high power semi-conductor devices. Indeed, for this reason heat sinks have been bonded to the exterior of such housings, but this still does not overcome the problem if there is a high density of electronic devices in the housing.

SUMMARY OF THE INVENTION

The invention provides a housing for an electronic device, in which the housing includes a thermally conducting flexible membrane which is urged into thermal contact with the electronic device, and which is sealed to the remainder of the housing.

The use of a flexible thermally conducting membrane as part of the housing enables thermal contact to be made with a large area of the electronic device even if it is not set parallel to the substrate on which it is mounted or even if it is not flat e.g. some forms of resistor or capacitor. Further, the flexible membrane is sealed to the remainder of the housing and creates a hermetic seal in an inexpensive manner.

The membrane may be urged into thermal contact with the housing by evacuation of the housing, or by pressure external to the housing.

Advantageously, there is provided a second membrane, for example, of a polymer, in contact with the thermally conducting membrane, thermally conducting material being located in apertures in the second membrane in the region of the electronic device. A third membrane may be provided on the other side of the thermally conducting layer to the second membrane, thermally conducting material being located in apertures in the third membrane in the region of the electronic device. The material in the apertures may then be in direct contact both with the device (either the naked device or its package) and with a heat sink.

The invention also provides a method of containing an electronic device, which comprises the steps of inserting the device in a housing, sealing a thermally conducting flexible membrane to the housing, and urging the flexible membrane into thermal contact with the electronic device.

BRIEF DESCRIPTION OF THE DRAWINGS

The invention will now be described in detail by way of example with reference to the accompanying drawings in which.

DETAILED DESCRIPTION OF THE PREFERRED EMBODIMENT

Figure 1:
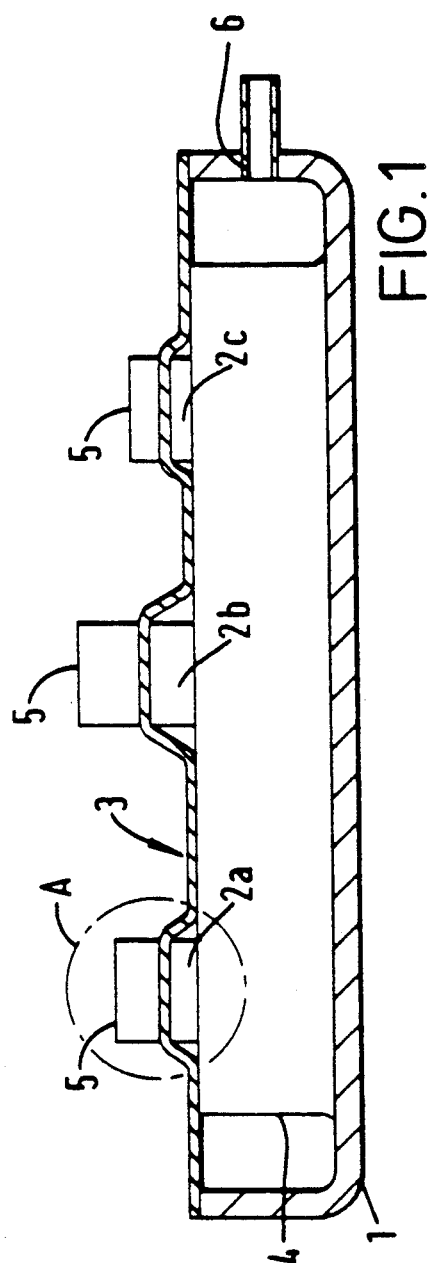
FIG. 1 is an elevational section through a first form of housing.

Referring to FIG. 1, the housing comprises a base 1 containing electronic devices 2a, 2b and 2c which is closed by a composite flexible membrane indicated generally by the reference numeral 3. The electronic devices are mounted on a substrate 4. Heat sinks 5 are provided adjacent to each of the electronic devices.

The membrane 3 is welded or soldered to the base 1. A hole 6 is provided through which the housing can be evacuated.

Figure 2:
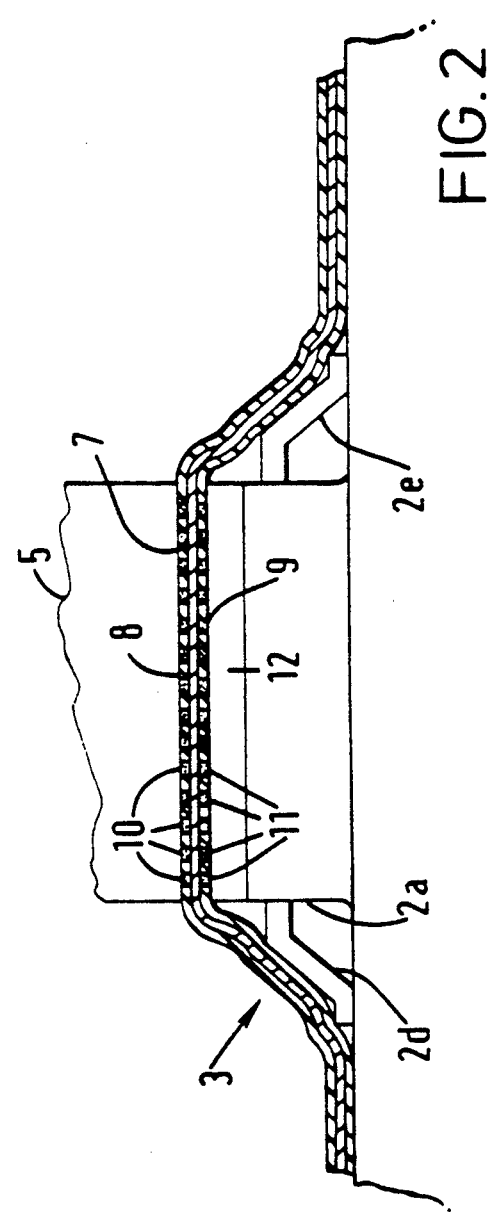
FIG. 2 in an elevational section through the area A in FIG. 1 on an enlarged scale.

Referring to FIG. 2, the composite membrane 3 consists of a thermally conducting flexible membrane in a form of a metal foil 7, which is sandwiched between a first membrane 8 and a second membrane 9, each in the form of a polymer, for example, polyvinyl chloride or polyimide, which are each perforated in the region of the electronic devices. The apertures 10, and 11 contain conducting material, which is in contact with a metal pad 12 at the top of the electronic device package (the pad could be several small pads), as well as being in contact with the heat sink 5.

In use, the electronic devices, which may be semi-conductor chips, are inserted in the housing, which is then evacuated at the hole 6 and then sealed. This results in a hermetically sealed housing, in which the conducting metal foil 7 is in thermal contact with the entire upper surface of the electronic devices, and also with respective heat sinks 5, by means of the material in the holes 10, 11. Because the polymer membranes 8 and 9 are only perforated in the region of the electronic device 2a, the metal foil 7 does not make electrical contact with the leads 2d, 2e of the electronic device 2a.

Figure 3:
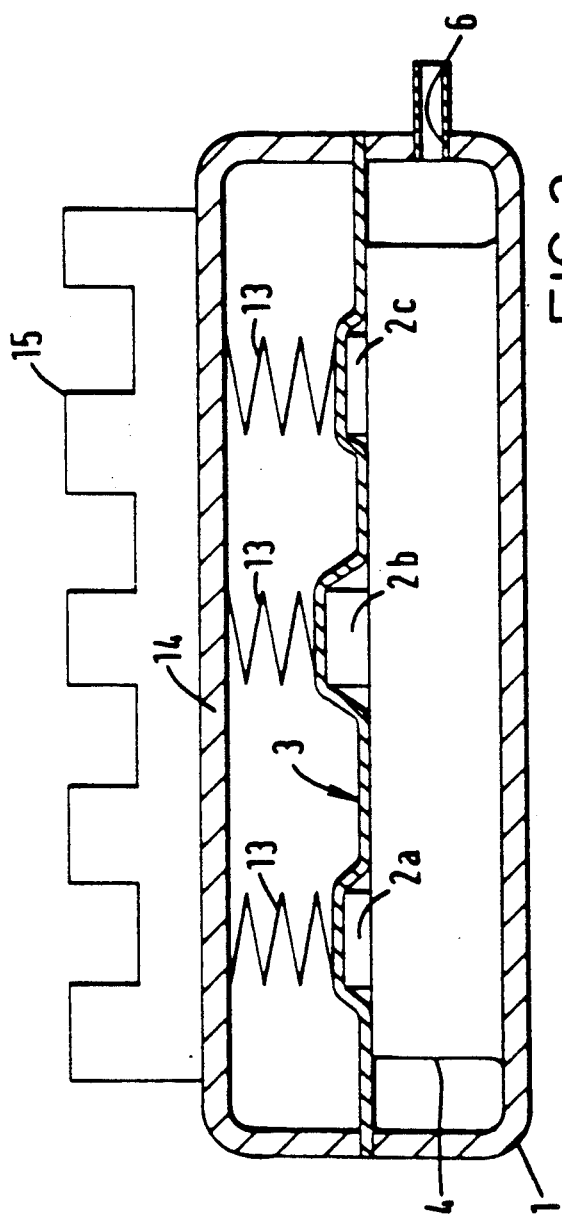
FIG. 3 in an elevational section through a second form of housing.

Referring to FIG. 3, the second form of housing differs from the first in that the method of conducting heat from the electronic devices is different. Otherwise, it is the same as the first, and like reference numerals have been used to denote like parts.

The housing is provided with an upper closure 14, through which gas or liquid coolant can pass, and the heat sinks for each electronic device consist of thin foil 13 in the form of a zig-zag which is pressed between the roof of the upper closure 14 and the composite flexible membrane 3. A large gas or liquid heat sink 15 is connected to the outside of the upper closure.

Figure 4:
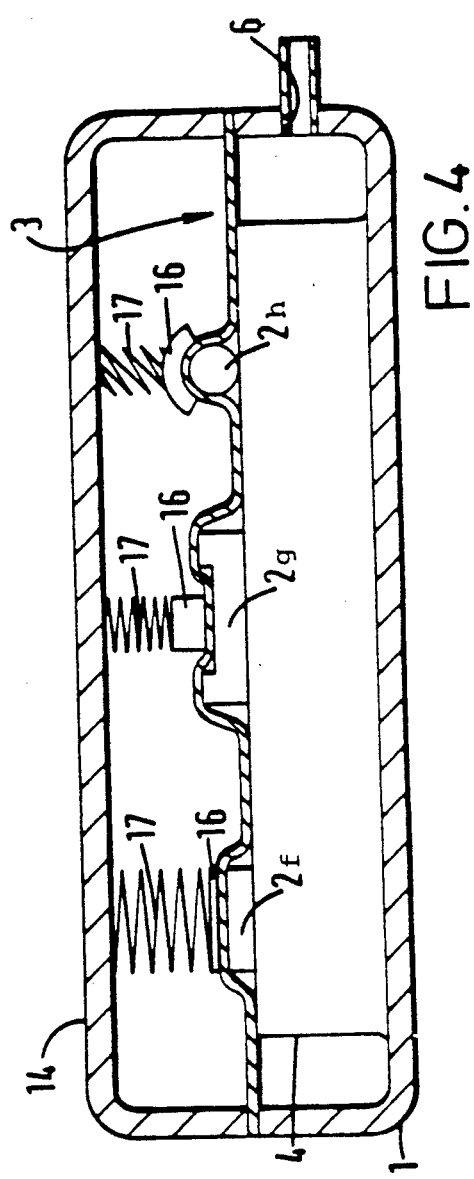
FIG. 4 is an elevational section through a third form of housing.

The third form of heat exchanger shown in FIG. 4 again differs from the first only in the form of heat sink, and the same reference numerals have been given to like parts.

Each electronic device is provided with a heat sink 16 and a light coil 17 to maintain the heat sink 16 in contact with the respective electronic device. In this case, the electronic device 2f is a naked semi-conductor chip, the electronic device 2g is a packaged semi-conductor chip, and the electronic device 2h is a resistor or capacitor.

Various modifications may of course be made without departing from the scope of the invention.

Thus, instead of evacuating the housings 1 to draw the composite membrane 3 into contact with the semi-conductor chips, the pressure outside the housings may be increased to press the membrane onto the surfaces of the chips. As another alternative, the upper closures shown in FIG. 3 and 4 could be filled with plastics material which is expanded to press the membrane 3 onto the chips.

The conducting material may be provided in the apertures 10, 11 simply by inserting an array of rivets through the composite membrane in the region of the electronic devices before contact is made with the electronic devices. However, as an alternative, the polymer membranes 8 and 9 may be drilled before the metal foil 7 is sandwiched between, either mechanically, or by means of laser action or by means of a plasma etch or a chemical etch. The foil is then laminated between the polymer layers. In the case of laser action, plasma etch and some kinds of chemical etch, the drilling can be done after the layers have been sandwiched together.

In order to insert conducting material into the apertures, conductive epoxies could be forced into them. Preferably, however, the sandwich is subjected to electroless plating, whereupon a conductive layer is keyed to the interior wall of the apertures. Electroplating is then used to build up a thicker conductive layer. The apertures will usually still have an unfilled region but the cylindrical region adjacent the wall of the aperture will be in contact with the foil.

The foil is preferably copper but could be gold (in the interest of ductility) nickel or other metals.

If it is found that, when the composite foil is drawn into contact with the electronic devices, it "tents" or bows so that the central region of the chip is no longer in contact with the foil, a rigid insert may form part of the laminate. The membrane 3 for example may be in two layers with a thin rigid plate of ceramic or steel in between the layers the region of the electronic device: this plate may also be perforated to allow the thermal conducting path across the foil, or it may itself be sufficiently thermally conductive.

Among the advantages of the arrangements described is that the composite layer can be readily separated from the chips (for example by relieving the vacuum) in order to rework the chips, and that the fabrication of the total device can be carried out with relatively simple equipment which would enable existing Printed Circuit Board manufacturers to use the technique.

I claim:

1. A package including at least one electronic device disposed on a substrate, comprising:
   a base having a perimeter upon which the substrate is disposed;
   a composite, thermally conductive flexible membrane attached to the perimeter of the base, the composite flexible membrane being in thermal contact with the at least one electronic device, said composite flexible membrane comprising a foil disposed between first and second flexible members each having apertures therein, said flexible member having apertures only in the region of the at least one electronic device and each of said first and second members having thermally conductive material disposed in the respective apertures thereof, the first flexible member being in thermal contact with the at least one electronic device; and
   a heat sink disposed adjacent to the at least one electronic device, the heat sink being in thermal contact with the apertures of the second flexible member.

2. The package defined in claim 1, wherein the thermal contact between the thermally conductive flexible membrane and the at least one electronic device is effected by evacuating the region between the flexible membrane and the base.

3. The package defined in claim 1, further comprising a closure disposed on the base.

4. The package defined in claim 3, wherein the thermal contact between the thermally conductive flexible membrane and the at least one electronic device is effected by pressurizing the region between the flexible membrane and the closure.

5. The package defined in claim 3, wherein the heat sink is a compression spring connecting the closure to the second flexible member in the respective regions adjacent to the at least one electronic device.

6. The package defined in claim 5, further comprising a coolant fluid flowing through the closure.

7. The package defined in claim 5, further comprising an exterior heat sink disposed on the closure.

8. A housing as claimed in claim 1, in which the second flexible member is a polymer.

9. A housing as claimed in claim 1, in which the thermally conducting membrane is of metal.

10. A housing as claimed in claim 1, in which there is provided a heat sink in thermally conducting contact with the thermally conducting membrane in the region of the electronic device.

11. A method of containing an electronic device, which comprises the steps of
    inserting the device in a housing;
    providing a composite thermally conducting flexible membrane comprising a thermally conductive foil interposed between first and second flexible members each having apertures therein, said first flexible member having apertures only in the region of the electronic device and each of said flexible members having thermally conducting material in their respective apertures, the apertures in said first and second flexible members being in thermal contact with the electronic device and the thermally conductive foil respectively sealing the thermally conducting flexible membrane to the housing; and
    urging the flexible membrane into thermal contact with the electronic device.

12. The method defined in claim 11, wherein the flexible membrane is urged into thermal contact with the electronic device by evacuating the housing.

* * * * *